(12) United States Patent
Iida et al.

(10) Patent No.: US 6,525,585 B1
(45) Date of Patent: Feb. 25, 2003

(54) FIXED-LENGTH DELAY GENERATION CIRCUIT

(75) Inventors: Tomohiro Iida, Tokyo (JP); Hiromichi Nogawa, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/015,211

(22) Filed: Nov. 16, 2001

(30) Foreign Application Priority Data

Nov. 21, 2000 (JP) .......................................... 2000-353847

(51) Int. Cl.[7] .............................................. H03H 11/26
(52) U.S. Cl. ........................ 327/279; 327/270; 327/273; 327/286
(58) Field of Search ................................. 327/279, 261, 327/264, 265, 270, 273, 276, 285, 286, 154, 155, 158, 160, 161, 162, 163

(56) References Cited

U.S. PATENT DOCUMENTS

| 5,570,294 A | * 10/1996 | McMinn et al. ............. 364/481 |
| 5,822,255 A | * 10/1998 | Uchida ......................... 365/194 |
| 5,939,913 A | * 8/1999 | Tomita ......................... 327/158 |
| 6,072,347 A | * 6/2000 | Sim ............................. 327/276 |
| 6,087,868 A | * 7/2000 | Millar ......................... 327/156 |
| 6,201,424 B1 | * 3/2001 | Harrison ..................... 327/159 |
| 6,242,959 B1 | * 6/2001 | Stern ........................... 327/262 |

FOREIGN PATENT DOCUMENTS

JP  63-046011  2/1988

* cited by examiner

*Primary Examiner*—Kenneth B. Wells
*Assistant Examiner*—Hai L. Nguyen
(74) *Attorney, Agent, or Firm*—Katten Muchin Zavis Rosenman

(57) ABSTRACT

A fixed-length delay generation circuit comprises a first variable delay circuit (VDC), a clock generation circuit, a VDC group including one or more second VDCs, and a delay controller. The clock signal is input to a second VDC disposed at the initial stage in the VDC group. The delay controller outputs a signal by which delay amount in the first and second VDCs are made smaller when a difference between phases of a delay clock signal output from the VDC group and of the clock signal generated by the clock generation circuit is greater than a predetermined value. The delay controller outputs a signal by which delay amount in the first and second VDCs are made larger when the difference between phases of a delay clock signal output from the VDC group and of the clock signal generated by the clock generation circuit is smaller than such value.

18 Claims, 7 Drawing Sheets

FIXED-LENGTH DELAY GENERATION CIRCUIT

BACKGROUND OF THE INVENTION

1. Field of the Invention

This invention relates to a fixed-length delay generation circuit for delaying an input signal, and more particularly to a fixed-length delay generation circuit designed to restrain variations in delay values caused by, for example, temperature variations.

2. Description of the Related Art

As a kind of delay circuit, a fixed-length delay generation circuit that adds delay to a data signal or a similar signal and outputs it is incorporated into, for example, an optical disk device in order to adjust processing timings in a circuit provided at a rear stage. This kind of delay circuit is described, for example, in Japanese Published.Unexamined Patent Application No. Sho 63-46011.

FIG. 1 is a block diagram showing a structure of a conventional delay circuit described in the patent application No. Sho 63-46011. The conventional delay circuit described herein is provided with a ring oscillator 23 made up of an inverter IV21 and a variable delay circuit 22. The output terminal of the inverter IV21 is connected to the input terminal of the variable delay circuit 22, and the output terminal of the variable delay circuit 22 is connected to the input terminal of the inverter IV21. The variable delay circuit 22 includes a plurality of stages of variable delay units in which two inverters are connected in series with each other. The conventional delay circuit further includes a phase/frequency comparator 27 that compares the phase/frequency of an output signal of a reference frequency oscillator 24 that oscillates a fixed-frequency signal with the phase/frequency of an output signal of the ring oscillator 23. The phase/frequency comparator 27 outputs a voltage (i.e., an analog signal) in accordance with a phase difference and a frequency. The conventional delay circuit further includes a variable delay circuit 21 that has the same structure as the variable delay circuit 22 and adds delay to, for example, a data input signal. A delay circuit control signal ctl, which is an output signal of the phase/frequency comparator 27, is input to the variable delay circuits 21 and 22.

In the thus constructed conventional delay circuit, a voltage that enlarges the on-resistance of the inverters that constitute the variable delay circuits 21 and 22 is output in the form of the delay circuit control signal ctl from the phase/frequency comparator 27, when the frequency of the ring oscillator 23 is high, i.e., when a delay value is smaller than a predetermined value. For this reason, delay values in the variable delay circuits 21 and 22 increase. On the other hand, when the frequency of the ring oscillator 23 is low, a voltage that lowers the on-resistance of the inverters that constitute the variable delay circuits 21 and 22 is output in the form of the delay circuit control signal ctl from the phase/frequency comparator 27. For this reason, delay values in the variable delay circuits 21 and 22 decrease. As a result, the frequency of the output signal of the ring oscillator 23 almost coincides with the frequency of the output signal of the reference frequency oscillator 24, and the frequency of the output signal of the variable delay circuit 21 also stabilizes. The delay value in the variable delay circuit 21 at this time reaches half (½) of the frequency in the variable delay circuit 21.

The patent application No. Sho 63-46011 further describes a delay circuit including a reference voltage source instead of the reference frequency oscillator. In this delay circuit, the frequency of an output signal from the ring oscillator is converted into a voltage, and this voltage is compared with a reference voltage of the reference voltage source, and, by feeding back the comparison result, a delay value is adjusted.

However, in the conventional delay circuit shown in FIG. 1, the delay value in the variable delay circuit 21 is intended to reach half the frequency of the output signal from the reference frequency oscillator 24. Although the delay value in the ring oscillator 23 can be set at that value, a structural difference corresponding to the inverter IV21 exists between the ring oscillator 23 and the variable delay circuit 21. Therefore, disadvantageously, the delay value in the variable delay circuit 21 cannot be set at just half the frequency of the output signal from the reference frequency oscillator 24. If the inverter IV21 is removed from the ring oscillator 23 in order to overcome this disadvantage, the ring oscillator 23 will be made up of an even number of inverters, thereby making it impossible to activate the circuit.

Additionally, since the variable delay circuits 21 and 22 are constructed by connecting inverters in series, it is extremely difficult to increase the operating speed (i.e., subdivide a delay time unit) and, at the same time, widen the dynamic range. For example, let us suppose that minimum and maximum delay values per stage of a variable delay unit are "s" and "t", respectively, and a variable delay circuit includes k stages of variable delay units. If so, a minimum delay value of this variable delay circuit is k×s, and a maximum delay value thereof is k×t. At this time, the minimum delay value k×s of the variable delay circuit is required to be made smaller, i.e., the number of stages k is required to be lessened, in order to increase the operating speed. However, a decrease in the number of stages k inevitably leads to a fall in the maximum delay value k×t, and therefore the dynamic range narrows. On the other hand, in order to widen the dynamic range, the number of stages k is required to be increased. However, an increase in the number of stages k leads to a rise in the minimum delay value: k×s, therefore leading to a fall in the maximum frequency of the ring oscillator 23 and to a fall in the operating speed.

Additionally, in most cases, the phase/frequency comparator 7 includes a charging-pump circuit in which a phase difference between two input signals is converted into a voltage through analog processing. Usually, the charging-pump circuit is provided with a P-channel transistor, an N-channel transistor, a resistance element, and a capacitive element. The variable delay unit is provided with a transistor that constitutes the inverter and adjusts a delay value such that the delay circuit control signal ctl is input to a gate so as to change on-resistance. Since many analog circuits are thus disposed in the conventional delay circuit shown in FIG. 1, another problem resides in that the conventional delay circuit is structurally liable to be influenced by manufacturing conditions and by temperature variations when used. Therefore, if the delay circuit is designed to become an integrated circuit (IC) having a high degree of integration, manufacturing variations and the like, will make it extremely difficult to obtain a desired operating condition.

Further, in the conventional delay circuit provided with the reference voltage source, since the reference voltage source is an analog circuit, the delay circuit is liable to be influenced by manufacturing conditions and by environmental changes when used, and it is extremely difficult to design a circuit capable of generating a reference voltage with high accuracy.

SUMMARY OF THE INVENTION

It is an object of the present invention to provide a fixed-length delay generation circuit capable of restraining a variation in delay values caused by manufacturing conditions and by environmental changes.

A fixed-length delay generation circuit according to the present invention comprises a first variable delay circuit, a clock generation circuit which generates a clock signal, a variable delay circuit group which includes one or more second variable delay circuits connected in series with each other, and a delay controller which controls delay in the first and second variable delay circuits. The second variable delay circuit generates a delay equal to a delay generated by the first variable delay circuit. The clock signal is input to a second variable delay circuit disposed at the initial stage in the variable delay circuit group. The delay controller outputs a digital signal by which delay amount in the first and second variable delay circuits are made smaller when a difference between a phase of a delay clock signal output from the variable delay circuit group and a phase of the clock signal generated by the clock generation circuit is greater than a predetermined value. The delay controller outputs a digital signal by which delay amount in the first and second variable delay circuits are made larger when the difference between a phase of a delay clock signal output from the variable delay circuit group and a phase of the clock signal generated by the clock generation circuit is smaller than the predetermined value.

In the present invention, the delay in the variable delay circuit group is subjected to feedback control based on a phase comparison between a delay clock signal output from the variable delay circuit group and a clock signal output from the clock generation circuit, and not based on a frequency comparison. At this time, the first variable delay circuit performs the feedback control and, at the same time, outputs an input signal to which a delay coinciding with a delay generated by the second variable delay circuit has been added, since the variable delay circuit group is made up of the one or more second variable delay circuits that generate a delay equal to a delay generated by the first variable delay circuit. Therefore, since the delay in the first variable delay circuit is controlled based on the phase comparison, the delay circuit is unsusceptible to input signals, element parameters, and environmental changes, and an error in the delay value is extremely difficult to occur. Further, the use of a reference frequency source, such as a quartz oscillator, having high accuracy and high stability as the clock generation circuit can make the delay circuit unsusceptible to manufacturing conditions and to environmental changes, compared with a conventional one in which a fixed-voltage source is a reference.

When the clock generation circuit is provided with a reference frequency oscillator that oscillates a reference clock signal with a fixed frequency and a frequency divider which divides the reference clock signal and generates the clock signal or a frequency multiplier which multiplies the reference clock signal and generates the clock signal, adjustment of a frequency division ratio in the frequency divider or a frequency multiplication rate in the frequency multiplier makes it possible to extremely easily adjust the delay value in the first variable delay circuit even after manufacture.

Further, when each of the first and second variable delay circuits is provided with a plurality of delay blocks which are connected in series to each other and the digital signal controls number of the delay blocks through which an input signal passes, the operating speed can be increased, and, coincidentally, the dynamic range can be widened.

DETAILED DESCRIPTION OF THE PREFERRED EMBODIMENTS

Figure 1:
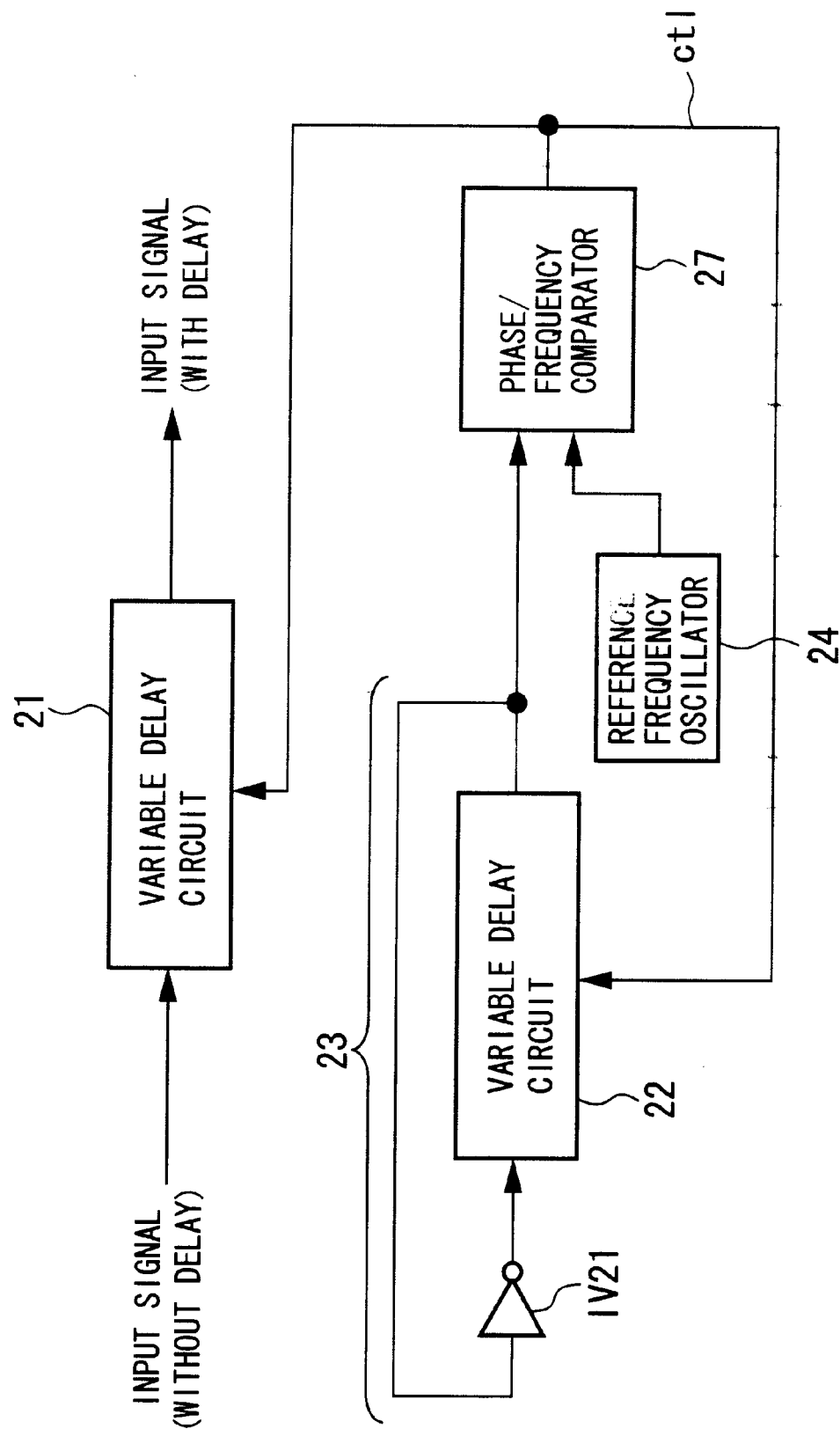
FIG. 1 is a block diagram showing a structure of a conventional delay circuit described in Japanese Published Unexamined Patent Application No. Sho 63-46011.
Figure 2:
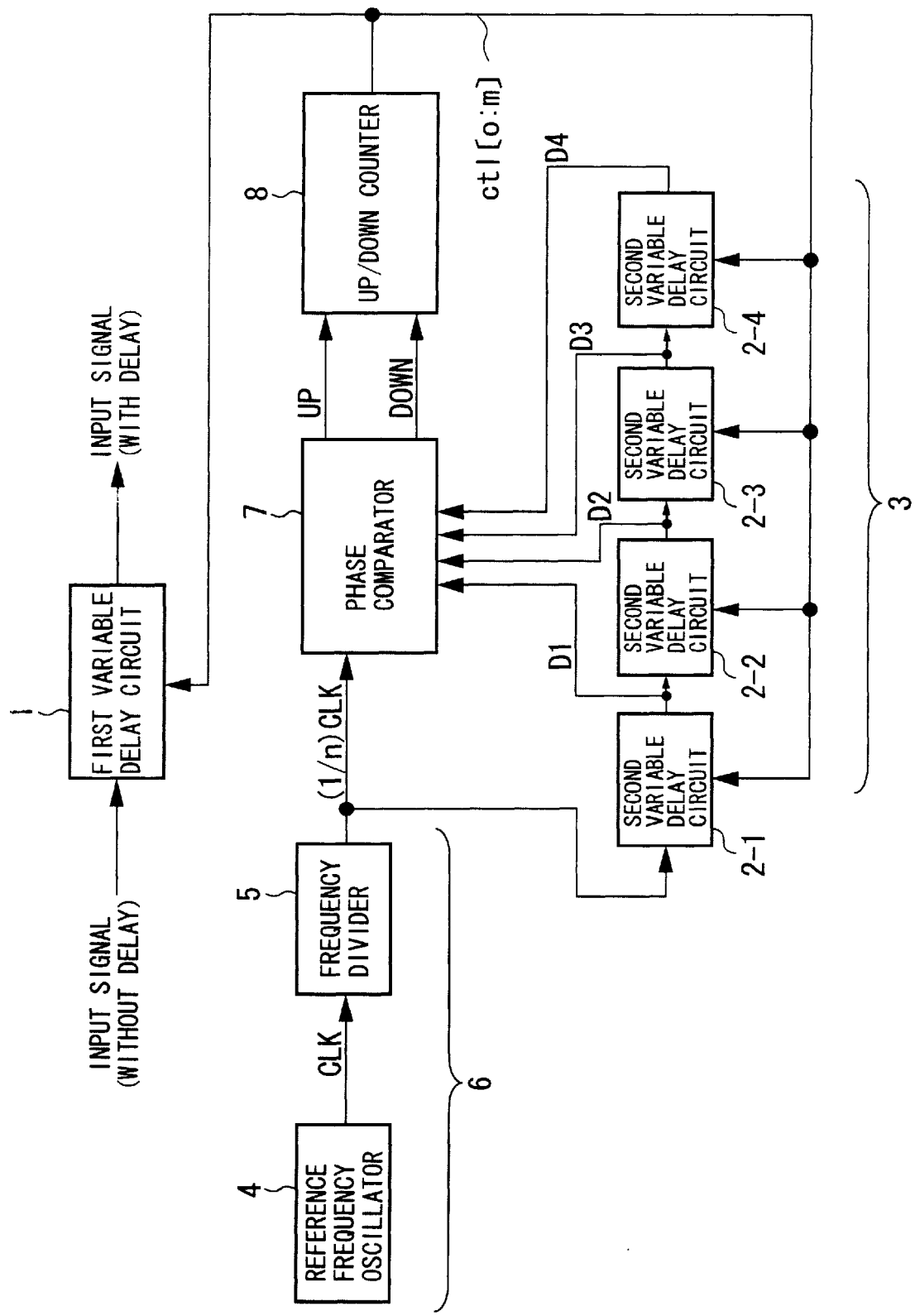
FIG. 2 is a block diagram showing a structure of a fixed-length delay generation circuit according to a first embodiment of the present invention.

Preferred embodiments of the present invention will be hereinafter described in detail with reference to the attached drawings. FIG. 2 is a block diagram showing a structure of a fixed-length delay generation circuit according to a first embodiment of the present invention.

The fixed-length delay generation circuit according to the embodiment is to be used as, for example, a delay circuit. The fixed-length delay generation circuit includes a reference frequency oscillator 4 that generates a clock signal CLK with a fixed reference frequency, and further includes a frequency divider 5 that multiplies the clock signal CLK output from the reference frequency oscillator 4 by 1/n ($n \geq 1$). A frequency-divided clock signal (1/n) CLK is output from the frequency divider 5. A clock generation circuit 6 may be made up of the reference frequency oscillator 4 and the frequency divider 5.

The fixed-length delay generation circuit further includes a variable delay circuit group 3 made up of four second variable delay circuits 2-1 through 2-4 that are connected in series with each other, for example. The frequency-divided clock signal (1/n) CLK is input to the second variable delay circuit 2-1 disposed at an initial stage. The second variable delay circuits 2-1 through 2-4 are the same in structure.

Figure 3:
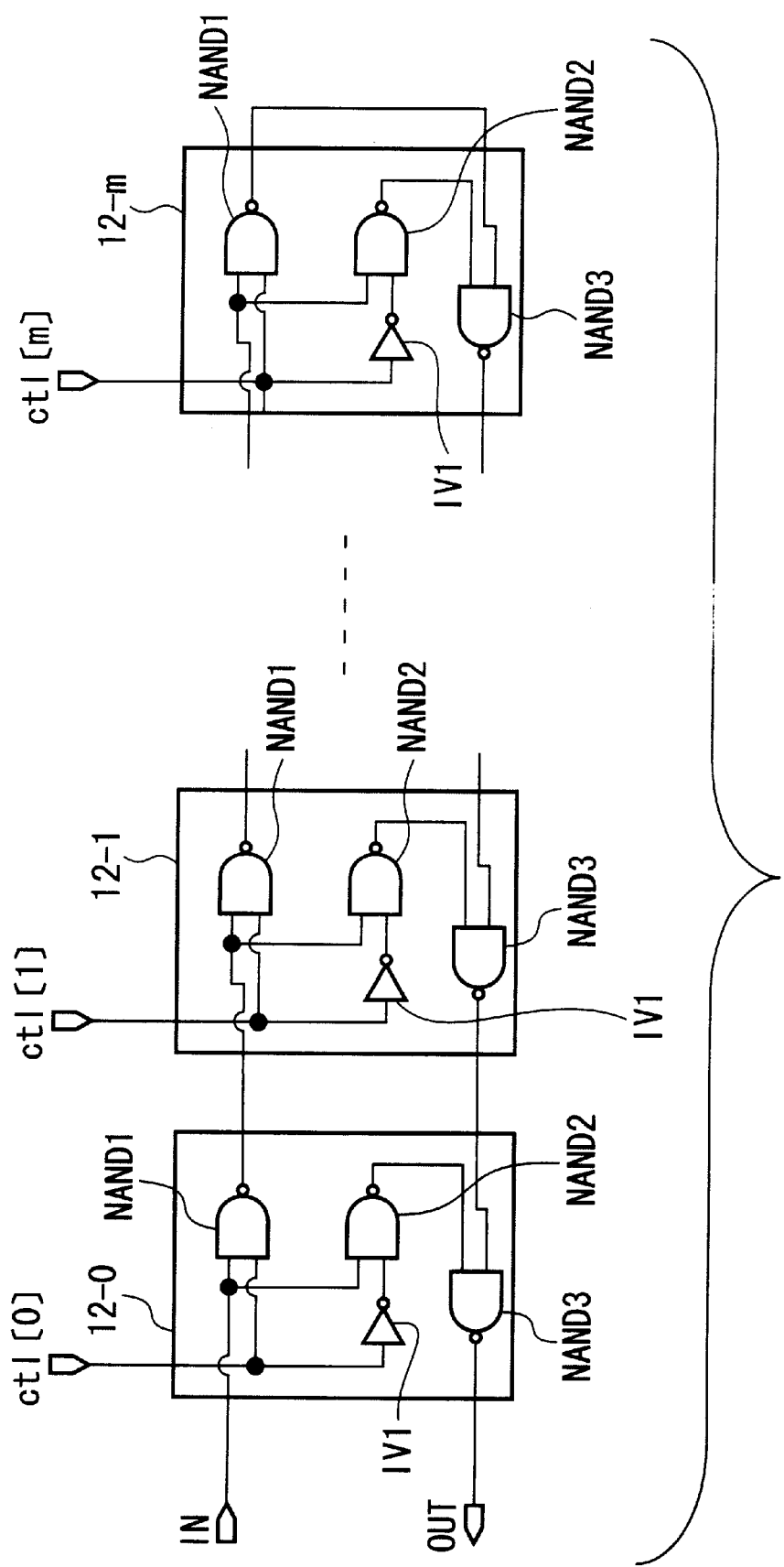
FIG. 3 is a circuit diagram showing a structure of a variable delay circuit according to the first embodiment of the present invention.

FIG. 3 is a circuit diagram showing a structure of the variable delay circuits. In each of the variable delay circuits, m+1 delay blocks 12-0, 12-1, . . . , 12-m are connected in series with each other. The frequency-divided clock signal (1/n) CLK or an output signal from the second variable delay circuit disposed at the preceding stage is input to the delay block 12-1 disposed at an initial stage in the form of an input signal IN. The delay block 12-0 includes an inverter IV1 that inverts a control bit ctl[0] sent from an UP/DOWN counter described later, a NAND circuit NAND1 that operates a NOT-AND operation for the input signal IN and the control bit ctl[0], a NAND circuit NAND2 that operates a NOT-AND operation for the output signal of the inverter IV1 and the input signal IN, and a NAND circuit NAND3 that operates a NOT-AND operation for the delayed output signal from the delay block 12-1 disposed at the subsequent stage and the output signal from the NAND circuit NAND2.

The delay blocks 12-1, . . . , 12-(m−1) each have the same structure as the delay block 12-0. However, it is not the input signal IN but an output signal that has passed through the delay block disposed at the preceding stage that is input to the NAND circuit NAND1 and to the NAND circuit NAND2 of the delay blocks 12-1, . . . , 12-(m−1). Additionally, it is not the control bit ctl[0] but the control bits ctl[1], . . . , ctl[m−1] that are input to the inverter IV1 and the NAND circuit NAND1 of the delay blocks 12-1, . . . , 12-(m−1), respectively.

The delay block 12-m disposed at the last stage has the same structure as each of the delay blocks 12-1, . . . , 12-(m−1), except that it is not the delayed output signal from the delay block disposed at the subsequent stage but the output signal from the NAND circuit NAND1 included in the delay block 12-m that is input to the NAND circuit NAND3, and it is not the control bit ctl[1] or the like but the control bit ctl[m] that is input to the inverter IV1 and the NAND circuit NAND1.

Each of the second variable delay circuits 2-1 through 2-4 is a variable delay circuit having the thus constructed (m+1) stages. If the delay value per stage is "r" and "m" kinds of delay values r, 2×r , . . . , m×r in total can be added to the input signal.

Figure 4:
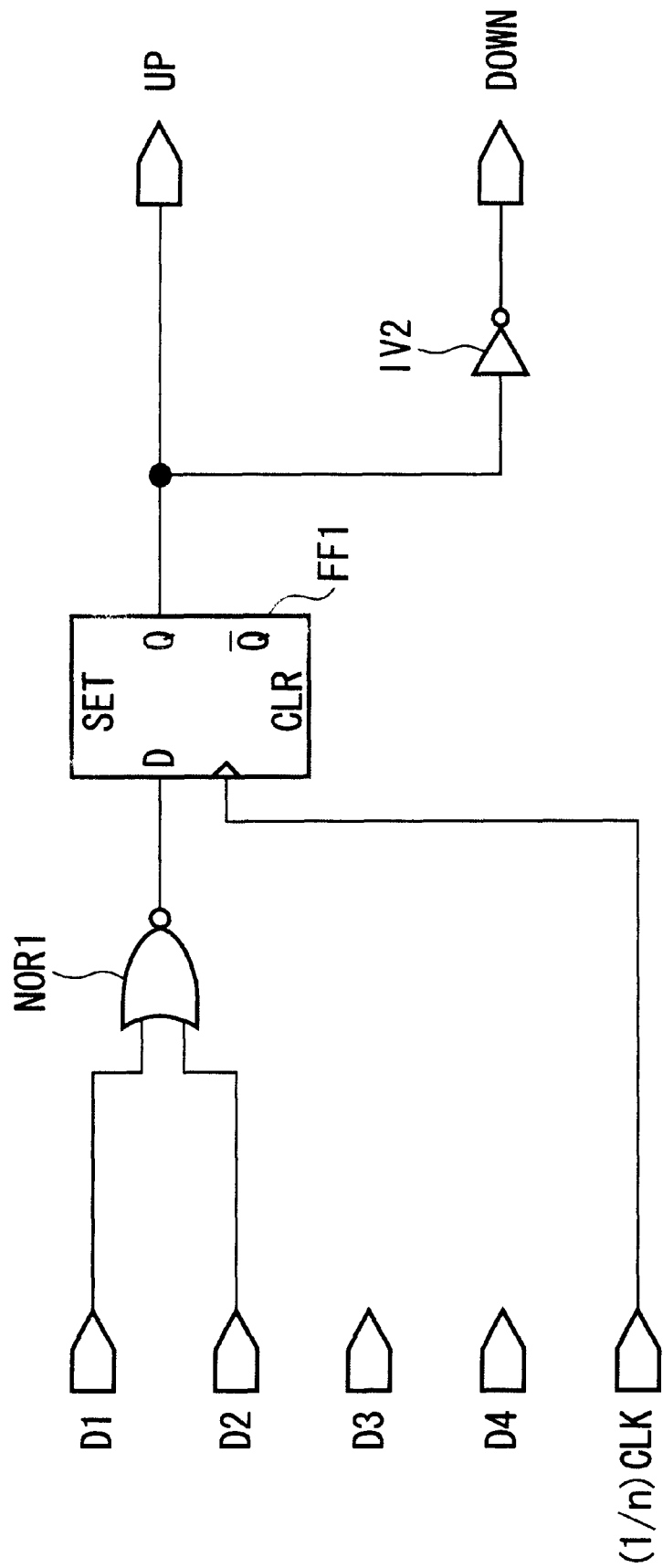
FIG. 4 is a block diagram showing a structure of a phase comparator 7.

The fixed-length delay generation circuit according to the embodiment further includes a phase comparator 7 with a 360° phase detection function that can detect whether the timing of phase 0° in an output signal D4 of the second variable delay circuit is earlier or later than the timing of phase 360° in the frequency-divided clock signal (1/n) CLK. FIG. 4 is a block diagram showing a structure of the phase comparator 7. The phase comparator 7 includes four input terminals to which output signals D1 through D4 from the second variable delay circuits 2-1 through 2-4 are respectively input, and an input terminal to which the frequency-divided clock signal (1/n) CLK is input. The phase comparator 7 further includes a NOR circuit NOR1 that operates a NOT-OR operation for the output signals D1 and D2, and a flip-flop FF1 in which an output signal of the NOR circuit NOR1 is input to a D-terminal and in which the frequency-divided clock signal (1/n) CLK is input to a clock input terminal. An up-signal UP is output from a Q-terminal of the flip-flop FF1. The phase comparator 7 further includes an inverter IV2 that inverts the up-signal UP and generates a down-signal DOWN. It is not absolutely necessary to provide two input terminals to which the output signals D3 and D4 are input respectively.

The fixed-length delay generation circuit according to the embodiment further includes an UP/DOWN counter 8 to which the up-signal UP and the down-signal DOWN are input and from which a delay circuit control signal ctl[0:m] with a (m+1) bit width is output. The phase comparator 7 and the UP/DOWN counter 8 make up a delay controller. When the up-signal UP is input, the UP/DOWN counter 8 sets control bits ctl[0], ctl[1], . . . , ctl[m] of the delay circuit control signal ctl[0:m] at "1 (high)" in order from the least significant bit (LSB) to the most significant bit (MSB). On the other hand, when the down-signal DOWN is input, the UP/DOWN counter 8 sets the control bits ctl[0], ctl[1], . . . , ctl[m] of the delay circuit control signal ctl[0:m] at "0 (low)" in order from the most significant bit (MSB) to the least significant bit (MSB). The delay circuit control signal ctl [0:m] is input to the second variable delay circuits 2-1 through 2-4. The following Table 1 shows variations in the delay circuit control signal ctl when the up-signal UP is input, and the following Table 2 shows variations in the delay circuit control signal ctl when the down-signal DOWN is input.

TABLE 1

| Number of inputs of the up-signal UP | ctl [0] | ctl [1] | ctl [2] | . . . | ctl [m − 1] | ctl [m] |
|---|---|---|---|---|---|---|
| Decrease | 1 | 0 | 0 | . . . | 0 | 0 |
|  | 1 | 1 | 0 | . . . | 0 | 0 |
|  | 1 | 1 | 1 | . . . | 0 | 0 |
|  | — | — | — |  | — | — |
|  | — | — | — |  | — | — |
| Increase | 1 | 1 | 1 | . . . | 1 | 0 |

TABLE 2

| Number of inputs of the up-signal DOWN | ctl [0] | ctl [1] | ctl [2] | . . . | ctl [m − 1] | ctl [m] |
|---|---|---|---|---|---|---|
| Decrease | 1 | 1 | 1 | . . . | 1 | 0 |
|  | — | — | — |  | — | — |
|  | — | — | — |  | — | — |
|  | 1 | 1 | 1 | . . . | 0 | 0 |
|  | 1 | 1 | 0 | . . . | 0 | 0 |
| Increase | 1 | 0 | 0 | . . . | 0 | 0 |

The fixed-length delay generation circuit further includes a first variable delay circuit 1 that has the same structure as the second variable delay circuits 2-1 through 2-4. As in the second variable delay circuit, the delay circuit control signal ctl[0:m] is input to the first variable delay circuit 1. A signal in which delay has been added to, for example, an input data signal is output from the first variable delay circuit 1.

Figures 5A, 5B, 5C, 5D:
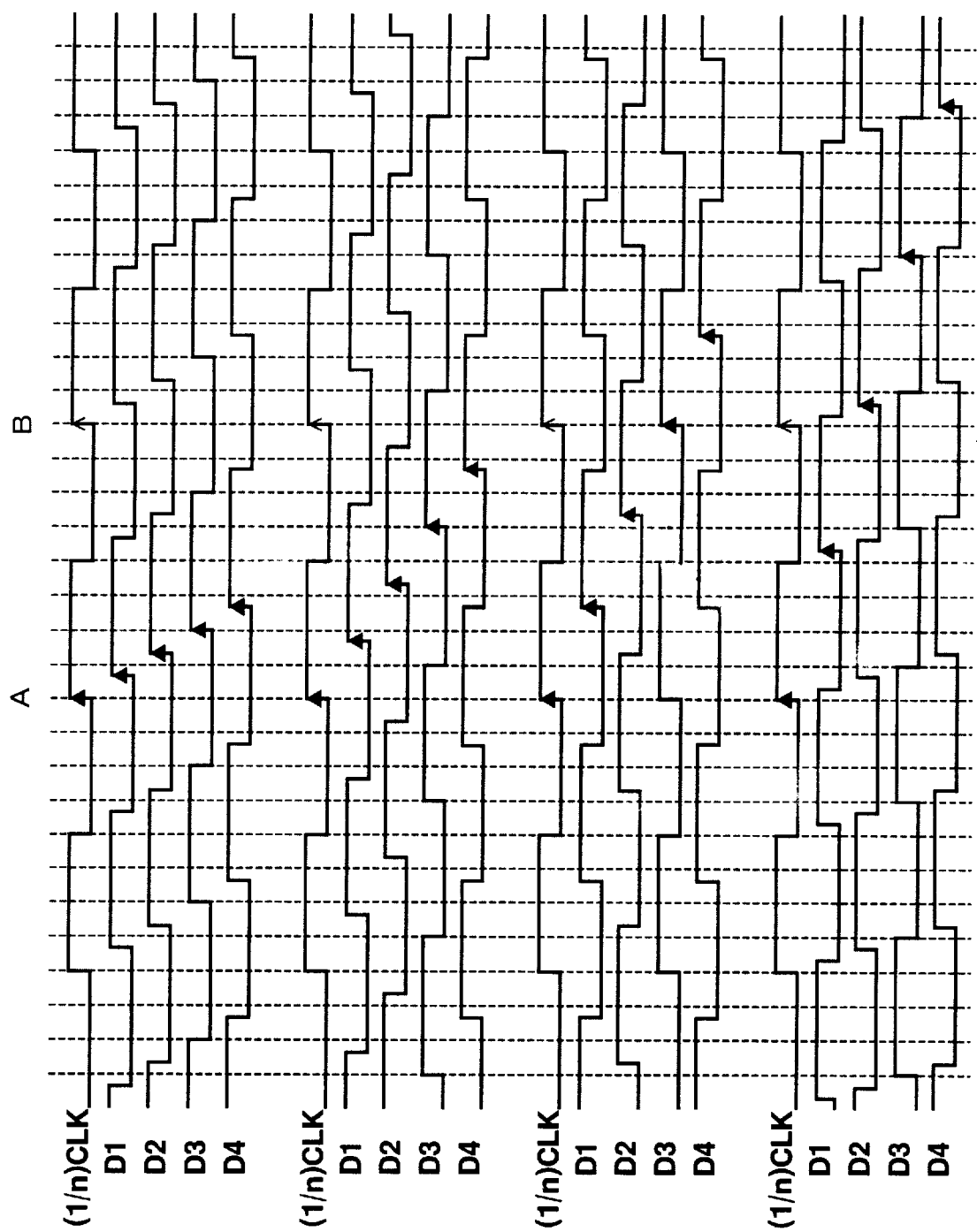
FIG. 5A through FIG. 5D are each a timing chart showing operation of the fixed-length delay generation circuit according to the first embodiment of the present invention.

Next, a description will be given of the operation of the fixed-length delay generation circuit constructed as above according to the embodiment. FIG. 5A through FIG. 5D show the operation of the fixed-length delay generation circuit according to the first embodiment of the present invention. FIG. 5A is a timing chart that shows a case in which the timing of phase 0° in the output signal D4 coincides with the timing of phases 0° to less than 180° in the frequency-divided clock signal (1/n) CLK. FIG. 5B is a timing chart that shows a case in which the timing of phase 0° in the output signal D4 coincides with the timing of phases 180° to less than 360° in the frequency-divided clock signal (1/n) CLK. FIG. 5C is a timing chart that shows a case in which the timing of phase 0° in the output signal D4 coincides with the timing of phases 360° to less than 720° in the frequency-divided clock signal (1/n) CLK. FIG. 5D is a timing chart that shows a case in which the timing of phase 0° in the output signal D4 coincides with the timing of phase 720° or more in the frequency-divided clock signal (1/n) CLK.

The clock signal CLK with a fixed frequency is output from the reference frequency oscillator 4. The clock signal CLK is input to the frequency divider 5, and the frequency-divided clock signal (1/n) CLK whose frequency is 1/n times as large as the frequency of the clock signal CLK is output from the frequency divider 5.

When the frequency-divided clock signal (1/n) CLK is input to the variable delay circuit group 3, a delay value corresponding to the delay circuit control signal ctl is added by the second variable delay circuits 2-1 through 2-4, and the resulting signal is output. In the second variable delay circuits 2-1 through 2-4, the following operations are carried out in accordance with the delay circuit control signal ctl. A delay block to which the control bit of "1" has been input inverts the input signal IN or the output signal that has passed through a delay block disposed at the preceding stage by means of the NAND circuit NAND1, and outputs it to a delay block disposed at the subsequent stage. The delayed output signal from the delay block disposed at the subsequent stage is inverted by the NAND circuit NAND3, and is output to the delay block disposed at the preceding stage or is output in the form of the output signal OUT. On the other hand, the delay block to which the control bit of "0" has been input inverts the input signal IN or the output signal that has passed through the delay block disposed at the preceding stage by means of the NAND circuit NAND2, and outputs it to the NAND circuit NAND3. The inverted signal is further inverted by the NAND circuit NAND3, and is output to the delay block disposed at the preceding stage or is output in the form of the output signal OUT.

For example, if the control bits ctl[0] and ctl[1] are each "1", and the other control bits ctl[2], ..., ctl[m] are each "0", the input signal IN passes through the delay blocks 12-0 and 12-1, is then returned by the delay block 12-2, and is output in the form of the output signal OUT through the delay blocks 12-1 and 12-0. In this case, a delay value for two stages, i.e., 2×r is added to the signal. On the other hand, if only the control bit ctl[m] is "0", and the other control bits ctl[0], ..., ctl[m−1] are each "1", the input signal IN passes through the delay blocks 12-0, ..., 12-(m−1), is then returned by the delay block 12-m disposed at the last stage, and is output in the form of the output signal OUT through the delay blocks 12-(m−1), ..., 12-0. In this case, a delay value for m stages, i.e., m×r is added.

The output signals D1 through D3 of the second variable delay circuits 2-1 through 2-3 are output to the second variable delay circuit disposed at the subsequent stage and to the phase comparator 7. The output signal D4 of the second variable delay circuit 2-4 is output to only the phase comparator 7. It is not absolutely necessary to output the output signals D3 and D4 to the phase comparator 7.

When the output signals D1 through D4 are input, the phase comparator 7 makes a comparison between the timing at the leading edge A of phase 0° (see FIG. 5A through FIG. 5D) in the delay clock signal (i.e., output signal D4) from the second variable delay circuit 2-4 disposed at the last stage and the timing at the leading edge B of phase 360° (see FIG. 5A through FIG. 5D) in the frequency-divided clock signal (1/n) CLK. In detail, the comparison is made by outputting the NOT-OR for the output signals D1 and D2 operated by the NOR circuit NOR1 from the flip-flop FF1 at the timing at the leading edge B in the frequency-divided clock signal (1/n) CLK.

For example, as shown in FIG. 5A, when the delay at the leading edge A in the output signal D4 is 0° to less than 180°, both of the output signals D1 and D2 are "0" at a timing of the leading edge B in the frequency-divided clock signal (1/n) CLK. Accordingly, the output signal of the NOR circuit NOR1 is "1". This signal is output from the flip-flop FF1 in the form of the up-signal UP.

Likewise, as shown in FIG. 5B, when the delay at the leading edge A in the output signal D4 is 180° to less than 360°, both of the output signals D1 and D2 are "0" at a timing of the leading edge B. Accordingly, the output signal of "1" of the NOR circuit NOR1 is output from the flip-flop FF1 in the form of the up-signal UP.

On the other hand, as shown in FIG. 5C and FIG. 5D, when the delay at the leading edge A in the output signal D4 exceeds 360°, one of the output signals D1 and D2 is "0", and the other one is "1" at a timing of the leading edge B. Accordingly, the output signal of the NOR circuit NOR1 is "0", and:this signal is output from the flip-flop FF1 in the form of the down-signal DOWN.

When the up-signal UP is input, the UP/DOWN counter 8 sets the control bits ctl[0], ctl[1], ..., ctl[m] of the delay circuit control signal ctl[0:m] at "1" in order from the least significant bit (LSB) side, and when the down-signal DOWN is input, the UP/DOWN counter 8 sets the control bits ctl[0], ctl[1], ..., ctl[m] thereof at "0" in order from the most significant bit (MSB) side, as mentioned above.

Therefore, as shown in FIG. 5A and FIG. 5B, when a delay value created by the variable delay circuit group 3 is smaller than one cycle of the frequency-divided clock signal (1/n) CLK, the up-signal UP is input from the phase comparator 7 to the UP/DOWN counter 8, and a delay circuit control signal ctl serving to increase the delay value by the amount of a delay block of one stage (i.e., by "r") in the first and second variable delay circuits is output from the UP/DOWN counter 8. These operations are repeatedly carried out until the delay value created by the variable delay circuit group 3 reaches one cycle of the frequency-divided clock signal (1/n) CLK.

On the other hand, as shown in FIG. 5C and FIG. 5D, when the delay value created by the variable delay circuit group 3 is larger than one cycle of the frequency-divided clock signal (1/n) CLK, the down-signal DOWN is input from the phase comparator 7 to the UP/DOWN counter 8, and a delay circuit control signal ctl serving to decrease the delay value by the amount of a delay block of one stage (i.e., by "r") in the first and second variable delay circuits is output from the UP/DOWN counter 8. These operations are repeatedly carried out until the delay value created by the variable delay circuit group 3 reaches one cycle of the frequency-divided clock signal (1/n) CLK.

Accordingly, the delay value $t_{delay}$ in the first variable delay circuit 1 is fixed at the value expressed by the following Formula 1, wherein f is the frequency of the clock signal CLK, n is the frequency division ratio in the frequency divider 5, and d is the number of second variable delay circuits disposed in the variable delay circuit group 3.

$$t_{delay} = \frac{1}{f} \times \frac{n}{d} \quad (1)$$

For example, let us suppose that the clock signal CLK whose frequency is 50 MHz is output from the reference frequency oscillator 4. Since the number of second variable delay circuits in the first embodiment is four, the delay value $t_{delay}$ is fixed at 6.7 nano-seconds when the frequency division ratio is adjusted to 1, the delay value $t_{delay}$ is fixed at 13.3 nano-seconds when the frequency division ratio is adjusted to 2, and the delay value $t_{delay}$ is fixed at 20.0 nano-seconds when the frequency division ratio is adjusted to 3.

Thus, according to the first embodiment, the adjustment of the frequency division ratio makes it possible to obtain a desired delay value when necessary. Variables at the right term of Formula 1 are not varied by input signals, element parameters, and temperature, and are independent of them. Therefore, an error in the delay value $t_{delay}$ seldom occurs. Further, according to the embodiment, the delay value is adjusted through a digitized operation only, and what is influenced by manufacturing conditions and temperature variations is only the delay value "r" per delay block of one stage in the variable delay circuit. Therefore, designing is extremely easy. Further, in each variable delay circuit, an input signal is returned by a delay block whose control bit is "0", and, accordingly, the minimum delay value is "r", and the maximum delay value is m×r, as described above. Therefore, the operating speed can be increased (i.e., a delay time unit can be subdivided), and the dynamic range can be widened, without obstructing either the speed increasing or the range widening. Further, since the delay value is adjusted based on a fixed frequency, the use of a reference frequency source, such as a quartz oscillator, having high accuracy and high stability can make the delay generation circuit unsusceptible to manufacturing conditions and to environmental changes, compared with a conventional circuit based on a fixed-voltage source.

In the first embodiment described above, the number of second variable delay circuits disposed in the variable delay circuit group 3 is four. However, the present invention is not limited to this. When a 360°-phase comparison is made by the phase comparator 7 as in the first embodiment, delay values $t_{delay}$ shown in Table 3 below can be obtained by adjusting the number of second variable delay circuits at a designing step. It should be noted that, in Table 3, the frequency of a clock signal CLK from the reference frequency oscillator 4 is 50 MHz.

TABLE 3

| Frequency division ratio n | Number d of second variable delay circuits | | | | |
|---|---|---|---|---|---|
|  | 1 | 2 | 3 | 4 | 5 |
| 1 | 20.0 | 10.0 | 6.7 | 5.0 | 4.0 |
| 2 | 40.0 | 20.0 | 13.3 | 10.0 | 8.0 |
| 3 | 60.0 | 30.0 | 20.0 | 15.0 | 12.0 |
| 4 | 80.0 | 40.0 | 26.7 | 20.0 | 16.0 |
| 6 | 120.0 | 60.0 | 40.0 | 30.0 | 24.0 |
| 8 | 160.0 | 80.0 | 53.3 | 40.0 | 32.0 |

Further, the phase of the frequency-divided clock signal that the phase comparator 7 compares with the delay clock signal from the second variable delay circuit disposed at the last stage is not limited to 360°. For example, a comparison may be made with the phase of 540° or 720° of the frequency-divided clock signal (1/n) CLK. In this case, a delay value $t_{delay}$ obtained by the first variable delay circuit 1 is expressed by the following Formula 2, wherein p is a phase (°) to be compared.

$$t_{delay} = \frac{1}{f} \times \frac{p}{360} \times \frac{n}{d} \quad (2)$$

Figure 6:
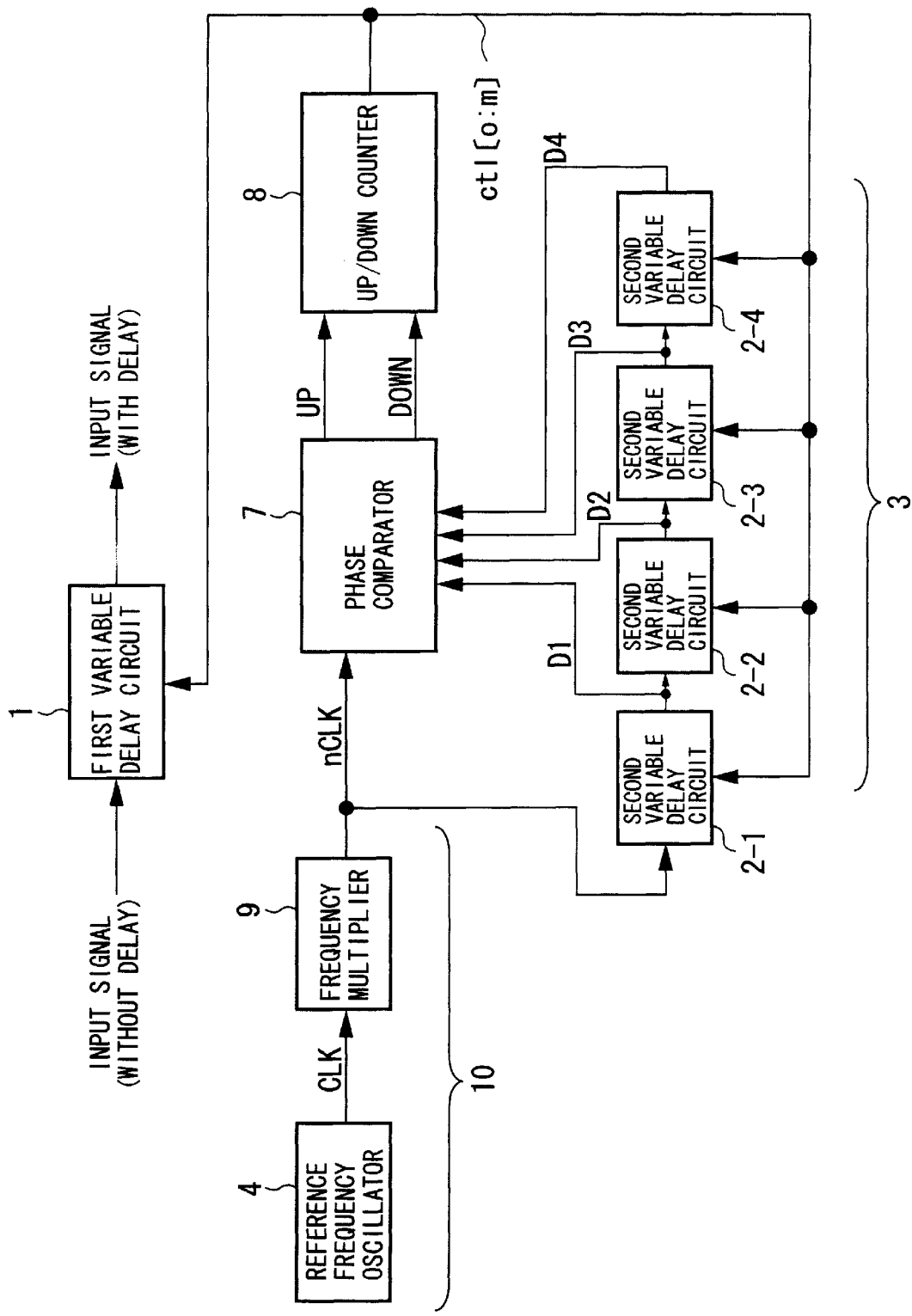
FIG. 6 is a block diagram showing a structure of a fixed-length delay generation circuit according to a second embodiment of the present invention.

Next, a second embodiment of the present invention will be described. FIG. 6 is a block diagram showing a structure of a fixed-length delay generation circuit according to the second embodiment of the present invention. In the second embodiment shown in FIG. 6, the same reference character is given to the same constituent part as in the first embodiment shown in FIG. 2, and a detailed description thereof is omitted.

In the second embodiment, a frequency multiplier 9, instead of the frequency divider 5 in the first embodiment, is disposed between the reference frequency oscillator 4, and the variable delay circuit group 3 and the phase comparator 7. The frequency multiplier 9 is a circuit in which the clock signal CLK having a fixed frequency that has been output from the reference frequency oscillator 4 is multiplied N times (N≧1) so as to output a multiplication clock signal NCLK. The reference frequency oscillator 4 and the frequency multiplier 9 make up a clock generation circuit 10.

In the second embodiment thus constructed, the delay value $t_{delay}$ in the first variable delay circuit 1 is fixed at a value expressed by the following Formula 3.

$$t_{delay} = \frac{1}{N \times f} \times \frac{1}{d} \quad (3)$$

Thus, according to the second embodiment, the adjustment of the frequency multiplication rate in the frequency multiplier 9 makes it possible to obtain a desired delay value when necessary. As in the first embodiment, variables at the right term of Formula 3 are not varied by input signals, element parameters, and temperature, and are independent of them. Therefore, an error in the delay value $t_{delay}$ seldom occurs.

As in the first embodiment, the number of second variable delay circuits is not limited to four. Further, the phase of the frequency-divided clock signal, which the phase comparator 7 compares with the delay clock signal from the second variable delay circuit disposed at the last stage, is not limited to 360°. In this case, a delay value $t_{delay}$ obtained by the first variable delay circuit 1 is expressed by the following Formula 4, wherein p is a phase (°) to be compared.

$$t_{delay} = \frac{1}{N \times f} \times \frac{p}{360} \times \frac{1}{d} \quad (4)$$

Figure 7:
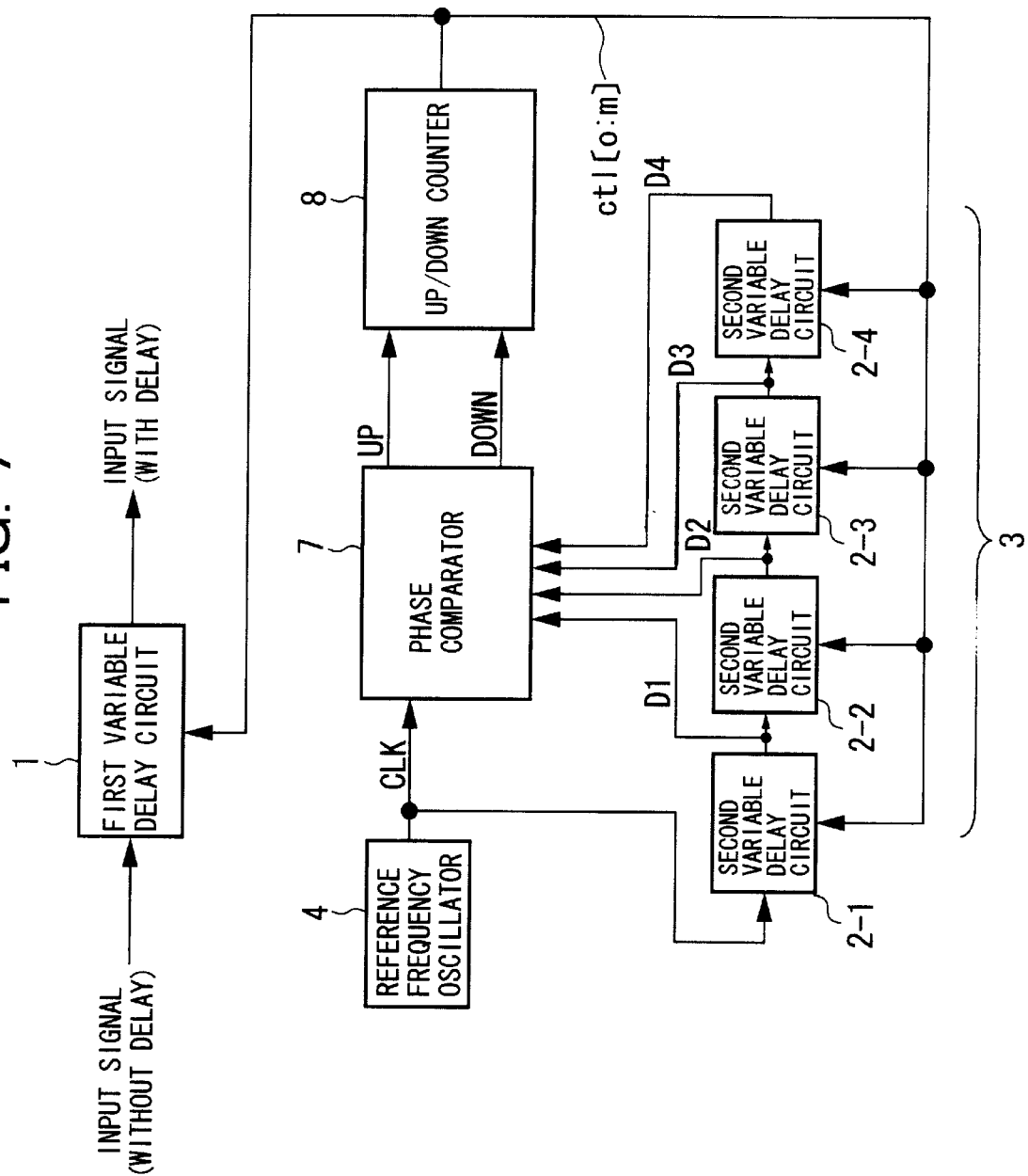
FIG. 7 is a block diagram showing a structure of a fixed-length delay generation circuit according to a third embodiment of the present invention.

Next, a third embodiment of the present invention will be described. FIG. 7 is a block diagram showing a structure of a fixed-length delay generation circuit according to the third embodiment of the present invention. In the third embodiment shown in FIG. 7, the same reference character is given to the same constituent part as in the first embodiment shown in FIG. 2, and a detailed description thereof is omitted.

In the third embodiment, the frequency divider 5 is not provided, and the reference frequency oscillator 4 is connected directly to the variable delay circuit group 3 and directly to the phase comparator 7. A clock generation circuit is constructed with only the reference frequency oscillator 4.

In the third embodiment thus constructed, the delay value $t_{delay}$ in the first variable delay circuit 1 is fixed at a value expressed by the following Formula 5.

$$t_{delay} = \frac{1}{f} \times \frac{1}{d} \quad (5)$$

Therefore, the third embodiment is suitable for a case where there is no need to adjust the delay value $t_{delay}$ created by the first variable delay circuit 1 after manufacture. However, the delay value $t_{delay}$ can be adjusted by adjusting the number f of second variable delay circuits at a designing step.

As in the first and second embodiments, the number of second variable delay circuits is not limited to four. Further, the phase of the frequency-divided clock signal, which is compared with the delay clock signal from the second variable delay circuit disposed at the last stage by means of the phase comparator 7, is not limited to 360°. In this case, a delay value $t_{delay}$ obtained by the first variable circuit 1 is expressed by the following Formula 6, wherein p is a phase (°) to be compared.

$$t_{delay} = \frac{1}{f} \times \frac{p}{360} \times \frac{1}{d} \qquad (6)$$

What is claimed is:

1. A fixed-length delay generation circuit comprising:
   a first variable delay circuit;
   a clock generation circuit which generates a clock signal;
   a variable delay circuit group which includes one or more second variable delay circuits connected in series with each other, said second variable delay circuit generating a delay equal to a delay generated by said first variable delay circuit, and said clock signal being input to a second variable delay circuit disposed at the initial stage in said variable delay circuit group; and
   a delay controller which controls delay in said first and second variable delay circuits, said delay controller outputting a digital signal by which delay amount in said first and second variable delay circuits are made smaller when a difference between a phase of a delay clock signal output from said variable delay circuit group and a phase of said clock signal generated by said clock generation circuit is greater than a predetermined value, and said delay controller outputting a digital signal by which delay amount in said first and second variable delay circuits are made larger when the difference between a phase of a delay clock signal output from said variable delay circuit group and a phase of said clock signal generated by said clock generation circuit is smaller than said predetermined value.

2. The fixed-length delay generation circuit according to claim 1, wherein said delay controller comprises a phase comparator which detects whether timing of phase 0(°) in said delay clock signal is earlier or later than timing of a predetermined phase in said clock signal.

3. The fixed-length delay generation circuit according to claim 2, wherein a delay amount generated by said first variable delay circuit is expressed by (1/f)×(p/360)×(1/d) (seconds), where f is a frequency (Hz) of said clock signal, d is a number of said second variable delay circuit(s), and p is said predetermined phase (°).

4. The fixed-length delay generation circuit according to claim 1, wherein said clock generation circuit comprises a reference frequency oscillator which oscillates a reference clock signal with a fixed frequency and a frequency divider which divides said reference clock signal and generates said clock signal.

5. The fixed-length delay generation circuit according to claim 2, wherein said clock generation circuit comprises a reference frequency oscillator which oscillates a reference clock signal with a fixed frequency and a frequency divider which divides said reference clock signal and generates said clock signal.

6. The fixed-length delay generation circuit according to claim 3, wherein said clock generation circuit comprises a reference frequency oscillator which oscillates reference clock signal with a fixed frequency and a frequency divider which divides said reference clock signal and generates said clock signal.

7. The fixed-length delay generation circuit according to claim 1, wherein said clock generation circuit comprises a reference frequency oscillator which oscillates a reference clock signal with a fixed frequency and a frequency multiplier which multiplies said reference clock signal and generates said clock signal.

8. The fixed-length delay generation circuit according to claim 2, wherein said clock generation circuit comprises a reference frequency oscillator which oscillates a reference clock signal with a fixed frequency and a frequency multiplier which multiplies said reference clock signal and generates said clock signal.

9. The fixed-length delay generation circuit according to claim 3, wherein said clock generation circuit comprises a reference frequency oscillator which oscillates a reference clock signal with a fixed frequency and a frequency multiplier which multiplies said reference clock signal and generates said clock signal.

10. The fixed-length delay generation circuit according to claim 1, wherein each of said first and second variable delay circuits comprises a plurality of delay blocks which are connected in series to each other, said digital signal controlling number of said delay blocks through which an input signal passes.

11. The fixed-length delay generation circuit according to claim 2, wherein each of said first and second variable delay circuits comprises a plurality of delay locks which are connected in series to each other, said digital signal controlling number of said delay blocks through which an input signal passes.

12. The fixed-length delay generation circuit according to claim 3, wherein each of said first and second variable delay circuits comprises a plurality of delay blocks which are connected in series to each other, said digital signal controlling number of said delay blocks through which an input signal passes.

13. The fixed-length delay generation circuit according to claim 4, wherein each of said first and second variable delay circuits comprises a plurality of delay blocks which are connected in series to each other, said digital signal controlling number of said delay blocks through which an input signal passes.

14. The fixed-length delay generation circuit according to claim 5, wherein each of said first and second variable delay circuits comprises a plurality of delay blocks which are connected in series to each other, said digital signal controlling number of said delay blocks through which an input signal passes.

15. The fixed-length delay generation circuit according to claim 6, wherein each of said first and second variable delay circuits comprises a plurality of delay blocks which are connected in series to each other, said digital signal controlling number of said delay blocks through which an input signal passes.

16. The fixed-length delay generation circuit according to claim 7, wherein each of said first and second variable delay circuits comprises a plurality of delay blocks which are connected in series to each other, said digital signal controlling number of said delay blocks through which an input signal passes.

17. The fixed-length delay generation circuit according to claim 8, wherein each of said first and second variable delay circuits comprises a plurality of delay blocks which are connected in series to each other, said digital signal controlling number of said delay blocks through which an input signal passes.

18. The fixed-length delay generation circuit according to claim 9, wherein each of said first and second variable delay circuits comprises a plurality of delay blocks which are connected in series to each other, said digital signal controlling number of said delay blocks through which an input signal passes.

* * * * *